(12) United States Patent
Jiang

(10) Patent No.: US 10,879,948 B2
(45) Date of Patent: *Dec. 29, 2020

(54) METALLIC SHELL, METHOD FOR MANUFACTURING THE SAME AND MOBILE TERMINAL HAVING THE SAME

(71) Applicant: GUANGDONG OPPO MOBILE TELECOMMUNICATIONS CORP., LTD., Guangdong (CN)

(72) Inventor: Zhengnan Jiang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/582,239

(22) Filed: Sep. 25, 2019

(65) Prior Publication Data

US 2020/0021326 A1    Jan. 16, 2020

Related U.S. Application Data

(63) Continuation of application No. 15/612,483, filed on Jun. 2, 2017, now Pat. No. 10,469,117.

(30) Foreign Application Priority Data

Aug. 3, 2016   (CN) .......................... 2016 1 0635464
Aug. 3, 2016   (CN) ...................... 2016 2 0842045 U

(51) Int. Cl.
*H04B 1/3888* (2015.01)
*H01Q 1/24* (2006.01)
(Continued)

(52) U.S. Cl.
CPC ..... *H04B 1/3888* (2013.01); *B29C 45/14639* (2013.01); *B32B 15/08* (2013.01);
(Continued)

(58) Field of Classification Search
CPC ... H04B 1/3888; H04M 1/0283; H01Q 1/243; G06F 1/1656; H05K 5/0004;
(Continued)

(56) References Cited

U.S. PATENT DOCUMENTS 10,447,325 B2 * 10/2019 Jiang ................... H05K 9/0088
10,469,117 B2 * 11/2019 Jiang ..................... H01Q 1/243
(Continued)

FOREIGN PATENT DOCUMENTS

CN          203246163 U       10/2013
CN          103770720 A        5/2014
(Continued)

OTHER PUBLICATIONS

Indian Patent Application No. 201734026971, Office Action dated Feb. 25, 2020, 6 pages.

(Continued)

*Primary Examiner* — Andrew Wendell
(74) *Attorney, Agent, or Firm* — Lathrop GPM LLP

(57) ABSTRACT

A metallic shell, a method for manufacturing the metallic shell and a mobile terminal including the metallic shell are provided. The metallic shell includes a body and an insulator. The body has a slot. The insulator is formed in the slot and includes an insulating material. The insulating material includes a plastic material, a first coating and a second coating. The first coating is configured to colour the plastic material to make the insulator exhibit a same colour as that of the body. The second coating is configured to improve luster of the plastic material to make the insulator exhibit a same metallic luster as that of the body.

15 Claims, 3 Drawing Sheets

(51) Int. Cl.
  *C23C 28/04* (2006.01)
  *B29C 45/14* (2006.01)
  *B32B 15/08* (2006.01)
  *B32B 15/20* (2006.01)
  *H05K 9/00* (2006.01)
  *B29L 31/34* (2006.01)

(52) U.S. Cl.
  CPC .............. *B32B 15/20* (2013.01); *C23C 28/04* (2013.01); *H01Q 1/243* (2013.01); *H05K 9/0049* (2013.01); *H05K 9/0088* (2013.01); *B29K 2995/0007* (2013.01); *B29K 2995/0021* (2013.01); *B29L 2031/3481* (2013.01); *B32B 2307/4026* (2013.01)

(58) Field of Classification Search
  CPC .......... H05K 5/0217; H05K 5/03; H05K 5/04; H05K 9/0088; H05K 9/0049; C23C 28/04; B32B 15/20; B32B 15/08; B32B 2307/4026; B29C 45/14639; B29K 995/0007; B29K 2995/0021; B29L 2031/3481
  See application file for complete search history.

(56) References Cited

U.S. PATENT DOCUMENTS

| | | |
|---|---|---|
| 2012/0220708 A1 | 8/2012 | Tanaka |
| 2013/0155627 A1 | 6/2013 | Mareno et al. |
| 2014/0284096 A1 | 9/2014 | Wu et al. |

FOREIGN PATENT DOCUMENTS

| | | |
|---|---|---|
| CN | 104262776 A | 1/2015 |
| CN | 104387686 A | 3/2015 |
| CN | 104845014 A | 8/2015 |

OTHER PUBLICATIONS

Chinese Patent Application No. 201710847483.2, Third Office Action dated Jul. 15, 2020, 10 pages.
Chinese Patent Application No. 201710847483.2, English translation of Third Office Action dated Jul. 15, 2020, 11 pages.
Indian Patent Application No. 201734026971, Hearing Notice dated Jul. 22, 2020, 2 pages.

* cited by examiner

METALLIC SHELL, METHOD FOR MANUFACTURING THE SAME AND MOBILE TERMINAL HAVING THE SAME

CROSS-REFERENCE TO RELATED APPLICATIONS

This application is a continuation of U.S. patent application Ser. No. 15/612,483 filed Jun. 2, 2017, which claims priority to and benefits of Chinese Patent Application Serial No. 201610635464.9 and No. 201620842045.8, both filed with the State Intellectual Property Office of P. R. China on Aug. 3, 2016, the entire contents of which are incorporated herein by reference.

FIELD

The present disclosure relates to mobile terminal technology fields, and more particularly to a metallic shell, a method for manufacturing the metallic shell and a mobile terminal having the metallic shell.

BACKGROUND

An antenna is part of a mobile terminal and is an important wireless device for transmitting and receiving communication signals when the mobile terminal communicates with a base station. When the mobile terminal transmits a communication signal, the antenna converts the electrical signal into an electromagnetic wave signal and sends it out, and at the same time, the received electromagnetic wave signal by the antenna can be converted into an electrical signal in time and output to the corresponding circuit inside the mobile terminal.

As the requirement on the appearance and touch of the mobile terminal by a user is improved, more and more mobile terminal shells are made of metal materials, that is, except for a front display screen, side and back surfaces of the entire body are made of a metal, thus making the mobile terminal have a better metal texture, greatly improving its appearance expressive ability, and also increasing the structural strength to a large extent. However, due to the electrostatic shielding effect, the metal shell design of the mobile terminal greatly affects the ability of the antenna to transmit and receive communication signals.

SUMMARY

A metallic shell, a method for manufacturing the metallic shell and a mobile terminal including the metallic shell are provided, so as to achieve colour and luster consistency of the metallic shell and thus improve aesthetics of the metallic shell appearance without any negative effect on the antenna.

According to a first aspect of the present disclosure, a metallic shell is provided. The metallic shell includes a body having a slot; and an insulator formed in the slot, wherein the insulator comprises an insulating material, the insulating material comprises a plastic material, a first coating and a second coating, the first coating is configured to colour the plastic material to make the insulator exhibit a same colour as that of the body, the second coating is configured to improve luster of the plastic material to make the insulator exhibit a same metallic luster as that of the body.

According to a second aspect of the present disclosure, a method for manufacturing a metallic shell is provided. The method includes providing a slot at a predetermined location of a body; filling an insulating material in the slot to form an insulator in the slot, the insulator comprising an insulating material, the insulating material comprising a plastic material, a first coating and a second coating, the first coating being configured to colour the plastic material to make the insulator exhibit a same colour as that of the body, the second coating being configured to improve luster of the plastic material to make the insulator exhibit a same metallic luster as that of the body.

According to a third aspect of the present disclosure, a mobile terminal is provided. The mobile terminal includes the metallic shell according to the first aspect.

In embodiments of the present disclosure, the first coating and the second coating are added into the plastic material to prepare the insulating material, so that the insulator filled in the slot by injection molding exhibits the same colour and luster as those of the body. The problem of inconsistence in appearances of the antenna partition bar and the body of the metallic shell is solved by filling the insulating material in the slot to form an insulator in the slot, thus ensuring the consistence in the appearances of the insulator and the body of the metallic shell without any negative effect on the antenna.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
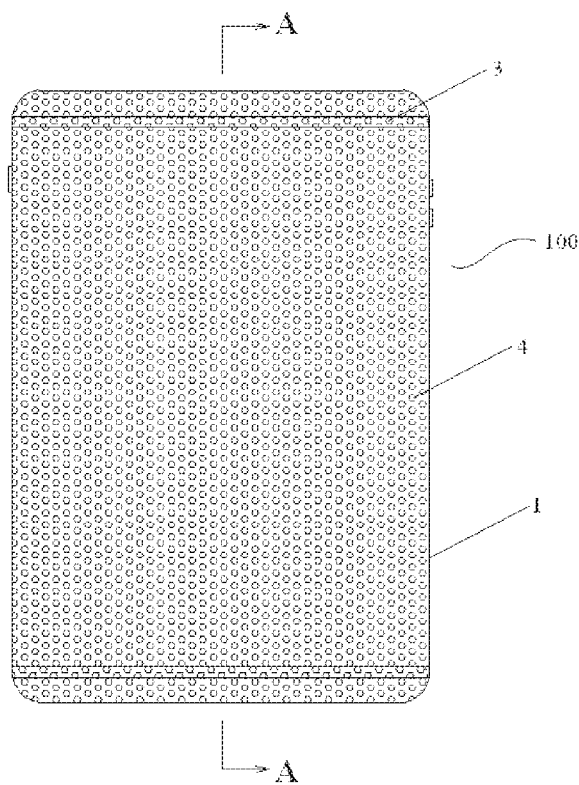
FIG. 1 is a schematic view of a metallic shell according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure. In addition, for ease of description, the accompanying drawings only show components related to the present disclosure, not all the structure.

FIG. 1 is a schematic view of a metallic shell 100 according to an embodiment of the present disclosure. As shown in FIG. 1, the metallic shell 100 includes a body 1.

The body 1 has a slot. An insulator 3 is formed in the slot and includes an insulating material. The insulating material includes a plastic material, a first coating and a second coating. Specifically, the first coating is configured to colour the plastic material to make the insulator 3 exhibit a same colour as that of the body 1. The second coating is configured to improve luster of the plastic material to make the insulator 3 exhibit a same metallic luster as that of the body 1.

The first coating is at a mass percentage comprised between 0.1% to 0.5% in the insulator, the second coating is at a mass percentage comprised between 0.1% to 1% in the insulator, and the balance is the plastic material. The plastic material includes polyphenylene sulfide (PPS), polybutylene terephthalate (PBT) or polyamide (PA). The first coating may be an organic coating, such as an azo coating (including monoazo, bisazo or azo lake), a phthalocyanine coating (including copper phthalocyanine, halogenated copper phthalocyanine or phthalocyanine lake) or a fused ring coating (isoindoline, isoindolinone or quinophthalone). Moreover, the first coating may also be an inorganic coating, such as a titanium oxide composite coating, a bismuth vanadate coating, an iron oxide coating, a lead chromate coating, a lead molybdate coating or an ultramarine coating. The second coating may include one or more compositions of a pearlescent coating, a silver slurry and an aluminum-silver slurry.

Figure 2:
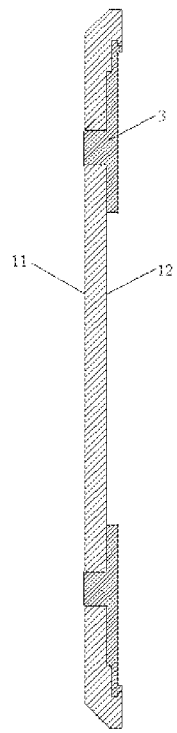
FIG. 2 is a sectional view of the metallic shell in FIG. 1 in a direction of A-A.

FIG. 2 is a sectional view of the metallic shell in FIG. 1 in a direction of A-A. As shown in FIG. 2, the slot in the body is at least one through-channel in a direction from a first surface (e.g., an outer surface) 11 to a second surface (e.g., an inner surface) 12 of the body, thus interrupting the closed circuit of the body and avoiding negatively affecting the ability of the antenna to transmit and receive communication signals due to the electrostatic shielding effect. The insulator 3 is filled in the through-channel. Thus, after the metallic shell is assembled to a mobile terminal, foreign matters are prevented from passing through the channel into the interior of the mobile terminal.

According to the present embodiment, the first coating and the second coating are added into the plastic material to prepare the insulating material, so that the insulator filled in the slot by injection molding exhibits the same colour and luster as those of the body. The problem of inconsistence in appearances of the antenna partition bar and the body of the metallic shell is solved by filling the insulating material in the slot to form an insulator in the slot, thus ensuring the consistence in the appearances of the insulator and the body of the metallic shell without any negative effect on the antenna. In such a manner, a conventional step for spraying a color layer on the antenna partition bar may be omitted, so as to shorten the process, improve production efficiency, enhance metal texture of the whole device and achieve aesthetics effects.

In an embodiment of the present disclosure, the insulating material is filled in the slot by injection molding to form the insulator, so that the insulator is formed integrally with the body by an injection molding manner. In another embodiment of the present disclosure, the first coating and the second coating are uniformly dispersed in the plastic material, thus obtaining a uniform colour distribution on the surface of the insulation layer and showing a uniform and nature-like metallic luster. In a further embodiment of the present disclosure, the insulator is formed integrally with the body without any seam. Moreover, in an embodiment of the present disclosure, a height of the insulator 3 in the slot is the same as a depth of the slot, i.e. a surface (e.g., an outer surface) of the insulator 3 is aligned with the first surface 11 of the body 1. Thus, the metallic shell has a flat outer surface and a consistent appearance.

In an embodiment of the present disclosure, the metallic shell 100 may include a colour layer 4 provided on an outer surface of the metallic shell. As shown in FIG. 1, the insulator 3 may have the same colour and luster as those of the body 1, thus showing a visually seamless appearance and solving the problem of inconsistence in appearances of the antenna partition bar and the body of the metallic shell 100.

In an embodiment of the present disclosure, the metallic shell 100 may further include a metal oxide layer provided on the colour layer 4, thus improving abrasive resistance and corrosion resistance of the metallic shell 100.

In an embodiment of the present disclosure, the body comprises one or more compositions of aluminum, aluminum alloy, magnesium, magnesium alloy, stainless steel, copper, copper alloy, titanium and titanium alloy, thus providing a substrate colour and facilitating to colour the surface of the metallic shell by a surface treatment process (e.g., a physical vapor deposition process).

Figure 3:
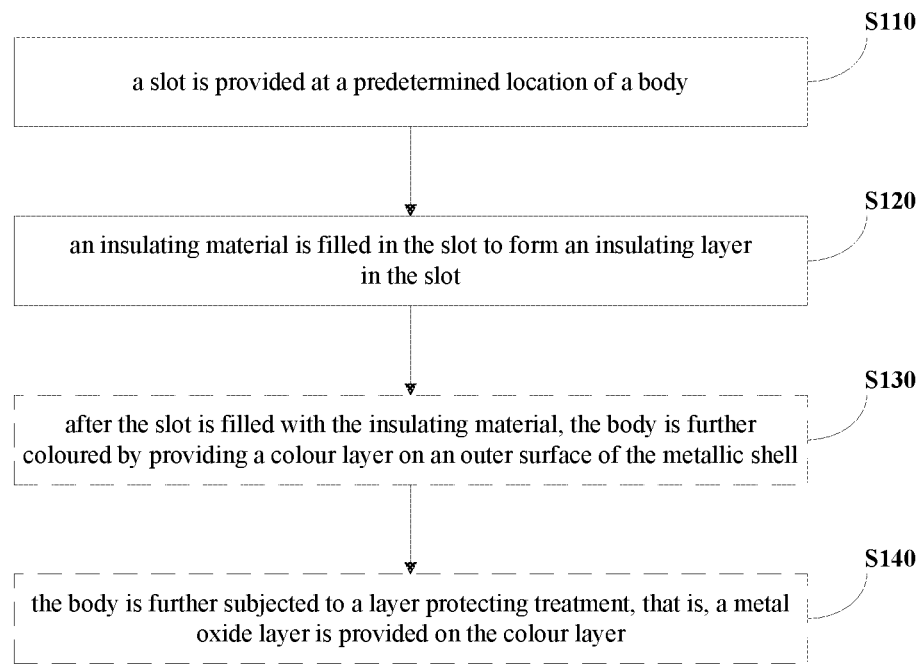
FIG. 3 is a block diagram of a method for manufacturing a metallic shell according to an embodiment of the present disclosure.

FIG. 3 is a block diagram of a method for manufacturing a metallic shell according to an embodiment of the present disclosure. The method is applied to prepare the metallic shell described above. As shown in FIG. 3, the method includes the following steps.

At block 110: a slot is provided at a predetermined location of a body.

Figure 4:
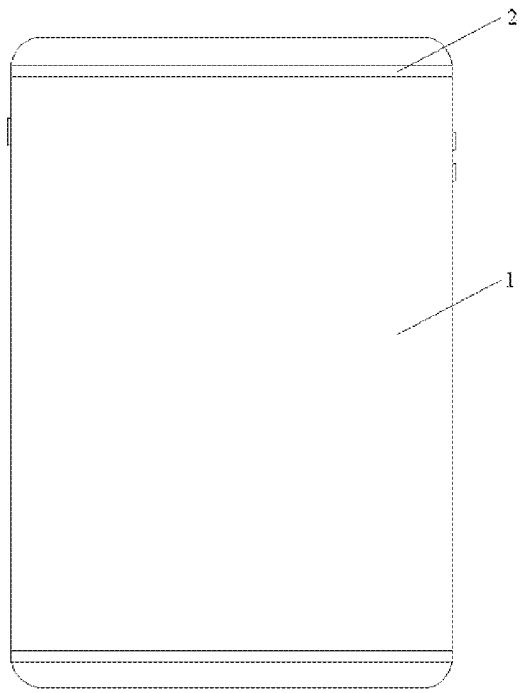
FIG. 4 is a schematic view of a metallic shell, which has been processed to define a slot, produced by a method for manufacturing a metallic shell according to an embodiment of the present disclosure.

FIG. 4 is a schematic view of a metallic shell, which has been processed to define a slot, produced by the method for manufacturing the metallic shell. As an example of a back metallic shell of a smartphone shown in FIG. 4, two through-channels are provided in a direction from a first surface to a second surface of a body 1 of the back metallic shell at a top and a bottom of the body 1 respectively to be used as slots 2, thus destroying the closeness of the body 1.

In an embodiment of the present disclosure, a slot may also be provided at a headset jack of the mobile terminal, thus increasing the number of the slots and further reducing the negative effect on the ability of the antenna to transmit and receive communication signals without destroying aesthetics of the metallic shell.

At block 120: an insulating material is filled in the slot to form an insulator in the slot.

Figure 5:
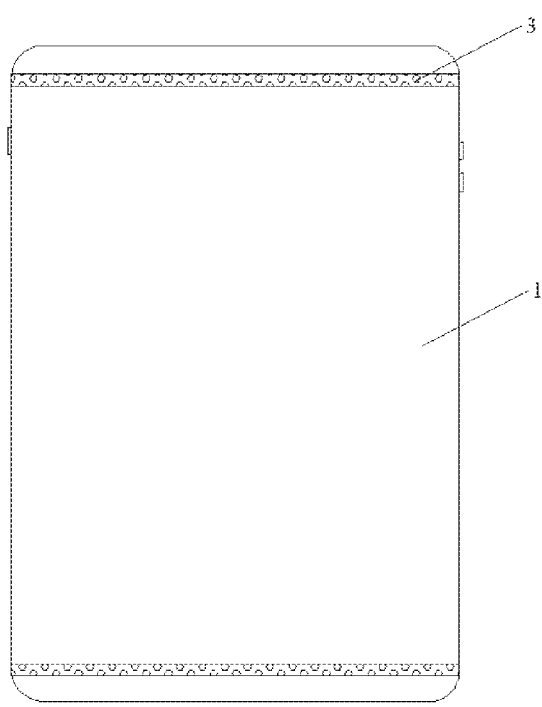
FIG. 5 is a schematic view of a metallic shell, in which an insulating material has been filled in a slot, produced by a method for manufacturing a metallic shell according to an embodiment of the present disclosure.

FIG. 5 is a schematic view of a metallic shell, in which an insulating material has been filled in the slot, produced by the method for manufacturing the metallic shell. The plastic material, the first coating and the second coating are filled in the slot by injection molding to provide the insulator 3, so that the insulting layer 3 is formed integrally with the body 1 without any seam. Moreover, in another embodiment of the present disclosure, a height of the insulator 3 in the slot is the same as a depth of the slot, i.e. a surface (e.g., an outer surface) of the insulator 3 is aligned with the first surface 11 of the body 1, so that the metallic shell 100 has a flat outer surface and a consistent appearance, thus obtaining the metallic shell shown in FIG. 5.

Specifically, the insulating material includes a plastic material, a first coating and a second coating. In addition, the first coating is configured to colour the plastic material to make the insulator exhibit a same colour as that of the body. The second coating is configured to improve luster of the plastic material to make the insulator exhibit a same metallic luster as that of the body.

In an embodiment, the second coating may include one or more compositions of a pearlescent coating, a silver slurry and an aluminum-silver slurry. Specifically, colour of pearlescent powder may be silver, shining gold, metallic color, rainbow interference color and a series of gradient colours, thus satisfying users' requirements for different colours of the metallic shell. Pearlescent powders with different particle sizes may be chosen according to actual practice. For example, in order to achieve a better coverage, pearlescent powders with a smaller size may be used, and the smaller the particle size is, the larger the coverage of the pearlescent powder is. For example, in order to achieve a better luster, pearlescent powders with a larger size may be used, and the larger the particle size is, the higher the luster of the pearlescent powder is.

The sliver slurry is a coating with a metal glittering effect, having advantages of a uniform particle size distribution, a smooth surface, a great glittering effect.

The aluminum-sliver slurry is a coating with a metal glittering effect. That is, through a special processing technology and surface treatment, a flat aluminum surface is obtained with a regular shape and a concentrated particle size distribution, thus achieving an excellent light reflection and metallic luster.

The inventors of the present disclosure have found that a mass percentage between 0.1% to 0.5% of the first coating (which may be a single coating or may be a mixture of several coatings according to actual needs) and a mass percentage between 0.1% to 1% of the pearlescent powder are added in the plastic material, and then the insulator is obtained in the slot by injection molding method. Thus, the insulator shows the colour needed actually and a better high-brightness effect, and exhibits the same colour and luster as those of the body.

In an embodiment of the present disclosure, the pearlescent powder added in the plastic material is at a mass percentage comprised between 0.5% to 1% in the insulator.

In an embodiment of the present disclosure, the silver slurry added in the plastic material is at a mass percentage comprised between 0.1% to 1% in the insulator.

In an embodiment of the present disclosure, the silver slurry added in the plastic material is at a mass percentage comprised between 0.5% to 1% in the insulator.

In an embodiment of the present disclosure, the aluminum-silver slurry added in the plastic material is at a mass percentage comprised between 0.1% to 1% in the insulator.

In an embodiment of the present disclosure, the aluminum-silver slurry added in the plastic material is at a mass percentage comprised between 0.5% to 1% in the insulator.

In an embodiment of the present disclosure, a mixture of any two of the pearlescent powder, the silver slurry and the aluminum-silver slurry added in the plastic material is at a mass percentage comprised between 0.1% to 1% in the insulator.

In an embodiment of the present disclosure, a mixture of any two of the pearlescent powder, the silver slurry and the aluminum-silver slurry added in the plastic material is at a mass percentage comprised between 0.5% to 1% in the insulator.

In an embodiment of the present disclosure, a mixture of the pearlescent powder, the silver slurry and the aluminum-silver slurry added in the plastic material is at a mass percentage comprised between 0.1% to 1% in the insulator.

In an embodiment of the present disclosure, a mixture of the pearlescent powder, the silver slurry and the aluminum-silver slurry added in the plastic material is at a mass percentage comprised between 0.5% to 1% in the insulator.

According to the present embodiment, the first coating and the second coating are added into the plastic material to prepare the insulating material, so that the insulator filled in the slot by injection molding exhibits the same colour and luster as those of the body. The problem of inconsistence in appearances of the antenna partition bar and the body of the metallic shell is solved by filling the insulating material in the slot to form an insulator in the slot, thus ensuring the consistence in the appearances of the insulator and the body of the metallic shell without any negative effect on the antenna. In such a manner, a conventional step for spraying a color layer on the antenna partition bar may be omitted, so as to shorten the process, improve production efficiency, enhance metal texture of the whole device and achieve aesthetics effects.

In an embodiment of the present disclosure, the method may also include the following steps.

At block 130: after the slot is filled with the insulating material, the body is further coloured by providing a colour layer on an outer surface of the metallic shell.

Specifically, the colour layer is prepared by methods including physical vapor deposition (PVD). After filling the insulating material, the body with the insulator is treated by PVD to provide the colour layer 4, as shown in FIG. 1. The PVD process may be performed on metals, such as stainless steel, copper, titanium, or zinc-aluminum alloy to provide chromium nitride (CrN), titanium nitride (TiN), titanium carbonitride (TiCN) and titanium aluminum nitride (TiAlN), thus providing a colour layer of gold, brass, rose gold, silver, black, smoke gray, copper, brown, purple, blue, wine red or bronze on the metal surface. Therefore, the insulator exhibits the same colour and luster as those of the body of the metallic shell, thus exhibiting a visually seamless appearance effect, and solving the problem of inconsistence in appearances of the antenna partition bar and the body of the metallic shell.

At block 140: the body is further subjected to a layer protecting treatment, that is, a metal oxide layer is provided on the colour layer.

Specifically, the protecting treatment includes an anodization method. The body with the insulting layer is placed in an electrolytic bath with an electrolytic solution of dilute sulfuric acid and used as an anode. After the electrolytic bath is powered on, the metal oxide layer (usually a porous white translucent film) is provided on the colour layer, thus improving the abrasive resistance and the corrosion resistance of metallic shell.

According to an embodiment of the present embodiment, a mobile terminal is provided, including the metallic shell as described in the above embodiment and a component for providing normal function of the mobile terminal. For example, the mobile terminal in the present embodiment may specifically be a terminal such as a mobile phone (e.g., a smartphone), a tablet computer, or a digital reader, preferably a smartphone. The metallic shell may be a back housing or a middle frame of a mobile terminal. The metallic shell is prepared by the method of manufacturing the metallic shell described above to make the insulator exhibit the same colour and luster as those of the body of the metallic shell, thus exhibiting a visually seamless appearance effect, and solving the problem of inconsistence in appearances of the antenna partition bar and the body of the metallic shell. Furthermore, in such a manner, a conventional step for spraying a color layer on the antenna partition bar may be omitted, so as to shorten the process, improve the production efficiency, enhance the metal texture of whole mobile terminal and achieve aesthetics effects.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. An insulator, applied in a shell, comprising an insulating material, wherein the insulating material comprises a plastic material, a first coating and a second coating, wherein
the plastic material comprises polyphenylene sulfide (PPS), polybutylene terephthalate (PBT) or polyamide (PA),
the first coating is one of a bismuth vanadate coating, a lead chromate coating, a lead molybdate coating or an ultramarine coating and configured to colour the plastic material to make the insulator exhibit a metallic colour, and
the second coating is configured to improve luster of the plastic material to make the insulator exhibit a metallic luster,
the first coating and the second coating are uniformly dispersed in the plastic material.

2. The insulator according to claim 1, wherein the first coating is at a mass percentage comprised between 0.1% to 0.5% in the insulator.

3. The insulator according to claim 1, wherein the second coating comprises one or more compositions of a pearlescent coating, a silver slurry and an aluminum-silver slurry.

4. The insulator according to claim 1, wherein the second coating is at a mass percentage comprised between 0.1% to 1% in the insulator.

5. The insulator according to claim 4, wherein the second coating is at a mass percentage comprised between 0.5% to 1% in the insulator.

6. A shell, comprising:
a body having a slot, wherein the slot in the body is at least one through-channel in a direction from a first surface to a second surface of the body; and
an insulator formed in the slot, comprising an insulating material, wherein the insulating material comprises a plastic material, a first coating and a second coating, wherein
the plastic material comprises polyphenylene sulfide (PPS), polybutylene terephthalate (PBT) or polyamide (PA),
the first coating is one of a bismuth vanadate coating, a lead chromate coating, a lead molybdate coating or an ultramarine coating and configured to colour the plastic material to make the insulator exhibit a metallic colour, and
the second coating is configured to improve luster of the plastic material to make the insulator exhibit a metallic luster,
the first coating and the second coating are uniformly dispersed in the plastic material.

7. The shell according to claim 6, wherein the insulator is formed integrally with the body by an injection molding manner.

8. The shell according to claim 6, wherein a height of the insulator in the slot is the same as a depth of the slot.

9. The shell according to claim 6, further comprising a colour layer provided on the first surface of the shell.

10. The shell according to claim 9, further comprising a metal oxide layer provided on the colour layer.

11. The shell according to claim 6, wherein the body comprises one or more compositions of aluminum, aluminum alloy, magnesium, magnesium alloy, stainless steel, copper, copper alloy, titanium and titanium alloy.

12. The shell according to claim 6, wherein a slot is provided at a predetermined location of the body.

13. The shell according to claim 6, wherein the second coating comprises one or more compositions of a pearlescent coating, a silver slurry and an aluminum-silver slurry.

14. The shell according to claim 6, wherein the first coating is at a mass percentage comprised between 0.1% to 0.5% in the insulator and the second coating is at a mass percentage comprised between 0.1% to 1% in the insulator.

15. A mobile terminal comprising a shell comprising:
a body having a slot, wherein the slot in the body is at least one through-channel in a direction from a first surface to a second surface of the body; and
an insulator formed in the slot, comprising an insulating material, wherein the insulating material comprises a plastic material, a first coating and a second coating, wherein
the plastic material comprises polyphenylene sulfide (PPS), polybutylene terephthalate (PBT) or polyamide (PA),
the first coating is one of a bismuth vanadate coating, a lead chromate coating, a lead molybdate coating or an ultramarine coating and configured to colour the plastic material to make the insulator exhibit a metallic colour, and
the second coating is configured to improve luster of the plastic material to make the insulator exhibit a metallic luster,
the first coating and the second coating are uniformly dispersed in the plastic material.

* * * * *